US008780562B2

(12) United States Patent
Yang

(10) Patent No.: US 8,780,562 B2
(45) Date of Patent: Jul. 15, 2014

(54) HEAT DISSIPATER HAVING HEAT CONDUCTIVE RIB WITH INTERVAL FORMING AS FLOW GUIDE HOLE AND APPLIED IN ELECTRIC LUMINOUS BODY

(76) Inventor: Tai-Her Yang, Dzan-Hwa (TW)

( * ) Notice: Subject to any disclaimer, the term of this patent is extended or adjusted under 35 U.S.C. 154(b) by 244 days.

(21) Appl. No.: 13/554,137

(22) Filed: Jul. 20, 2012

(65) Prior Publication Data

US 2014/0022732 A1 Jan. 23, 2014

(51) Int. Cl.
*H05K 7/20* (2006.01)
*F21V 29/00* (2006.01)

(52) U.S. Cl.
USPC ........... 361/710; 361/702; 361/703; 361/704; 361/707; 361/709; 165/80.3; 362/294

(58) Field of Classification Search
None
See application file for complete search history.

(56) References Cited

U.S. PATENT DOCUMENTS 6,798,878 B2 * 9/2004 Laetsch ......................... 379/338
6,927,979 B2 * 8/2005 Watanabe et al. ............. 361/697
7,475,718 B2 * 1/2009 Reyzin et al. ............ 165/104.33
7,513,653 B1 * 4/2009 Liu et al. ........................ 362/294
7,532,472 B2 * 5/2009 Lin et al. ........................ 361/697
7,729,119 B2 * 6/2010 Yang ............................. 361/700
7,751,192 B2 * 7/2010 Abul-Haj et al. ............. 361/703
7,814,965 B1 * 10/2010 Spokoiny et al. ............ 165/80.3
7,878,686 B2 * 2/2011 Suehiro et al. ................ 362/294
8,004,836 B2 * 8/2011 Kauranen et al. ............. 361/690
8,164,237 B2 * 4/2012 Wen ................................ 313/46

* cited by examiner

*Primary Examiner* — Boris Chervinsky
(74) *Attorney, Agent, or Firm* — Bacon & Thomas, PLLC

(57) ABSTRACT

The present invention relates that a part of the outer bottom is combined with an intermediate heat conductor (102) the flow guide holes (300) are not totally shielded after combined, the interior of the heat dissipater (100) is installed with the heat conductive rib structure (310) for being combined with the inner periphery of the heat dissipater (100), the intermediate heat conductor is installed with the electric luminous body (200) and formed as the heat source, so the heat can be conducted to the surface of the heat conductive rib structure (310) and the heat dissipater (101), and with the fluid effect of hot ascent/cold descent, the airflow is enabled to upwardly flow from one side of the electric luminous body (200) through the flow guide holes (300) then flow out from the other side thereof.

17 Claims, 4 Drawing Sheets

HEAT DISSIPATER HAVING HEAT CONDUCTIVE RIB WITH INTERVAL FORMING AS FLOW GUIDE HOLE AND APPLIED IN ELECTRIC LUMINOUS BODY

BACKGROUND OF THE INVENTION (a) Field of the Invention

The present invention provides a heat dissipater having heat conductive rib with interval forming as flow guide hole and applied in electric luminous body in which a heat conductive rib structure (310) being installed inside the heat dissipater for meeting the heat dissipation requirement of an electric luminous body, e.g. the heat dissipation requirement of a light emitting diode (LED) which is adopted as the electric luminous body (200), and the intervals defined by the heat conductive rib structure (310) is formed as flow guide holes (300) penetrating both sides axially and throughout, the contour of the heat dissipater (100) includes being formed in a cylindrical, conical, polygonal cylindrical or polygonal conical shape, a part of the outer bottom is combined with an intermediate heat conductor (102) where the electric luminous body (200) being installed, the flow guide holes (300) are not totally shielded after the intermediate heat conductor (102) being combined with the heat dissipater (100), the interior of the heat dissipater (100) is installed with the heat conductive rib structure (310) for being combined with the inner periphery of the heat dissipater (100), the bottom thereof is installed with the intermediate heat conductor (102), the intermediate heat conductor (102) is installed with the electric luminous body (200) and formed as the heat source, so the heat from the electric luminous body (200) can be conducted through the intermediate heat conductor (102) to the surface of the heat conductive rib structure (310) and the surface of heat dissipater (101), thereby forming a larger heat dissipation area for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; the heat dissipater having heat conductive rib with interval forming as flow guide hole and applied in electric luminous body of the present invention utilizes the intervals defined by the heat conductive rib structure (310) for forming as the flow guide holes (300) penetrating both sides throughout, the heat dissipater (100) is further formed with flow guide holes allowing airflow to pass, and the installation location of flow guide hole includes one or more than one of the followings: (a) installing one or more radial flow guide holes (303) in the heat dissipater (100); (b) installing one or more flow guide holes (302), which axially penetrate the central column (103), at the axial core center.

(b) Description of the Prior Art

A conventional heat dissipation device applicable in the electric luminous body (200) of an electric illumination device, e.g. the heat dissipater used in a LED illumination device, usually transmits the heat generated by the LED to the heat dissipater then dissipates the heat to the exterior through the surface of the heat dissipater, thereby limiting the heat dissipation area.

SUMMARY OF THE INVENTION

A conventional heat dissipation device applicable in the electric luminous body (200) of an electric illumination device, e.g. the heat dissipater used in a LED illumination device, usually transmits the heat generated by the LED to the heat dissipater then dissipates the heat to the exterior through the surface of the heat dissipater, thereby limiting the heat dissipation area.

The present invention provides a heat dissipater having heat conductive rib with interval forming as flow guide hole and applied in electric luminous body in which a heat conductive rib structure (310) being installed inside the heat dissipater for meeting the heat dissipation requirement of an electric luminous body, e.g. the heat dissipation requirement of a light emitting diode (LED) which is adopted as the electric luminous body (200), and the intervals defined by the heat conductive rib structure (310) is formed as flow guide holes (300) penetrating both sides axially and throughout, the contour of the heat dissipater (100) includes being formed in a cylindrical, conical, polygonal cylindrical or polygonal conical shape, a part of the outer bottom is combined with an intermediate heat conductor (102) where the electric luminous body (200) being installed, the flow guide holes (300) are not totally shielded after the intermediate heat conductor (102) being combined with the heat dissipater (100), the interior of the heat dissipater (100) is installed with the heat conductive rib structure (310) for being combined with the inner periphery of the heat dissipater (100), the bottom thereof is installed with the intermediate heat conductor (102), the intermediate heat conductor (102) is installed with the electric luminous body (200) and formed as the heat source, so the heat from the electric luminous body (200) can be conducted through the intermediate heat conductor (102) to the surface of the heat conductive rib structure (310) and the surface of heat dissipater (101), thereby forming a larger heat dissipation area for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; the heat dissipater having heat conductive rib with interval forming as flow guide hole and applied in electric luminous body of the present invention utilizes the intervals defined by the heat conductive rib structure (310) for forming as the flow guide holes (300) penetrating both sides throughout, the heat dissipater (100) is further formed with flow guide holes allowing airflow to pass, and the installation location of flow guide hole includes one or more than one of the followings: (a) installing one or more radial flow guide holes (303) in the heat dissipater (100); (b) installing one or more flow guide holes (302), which axially penetrate the central column (103), at the axial core center.

DESCRIPTION OF MAIN COMPONENT SYMBOLS

Figure 1:
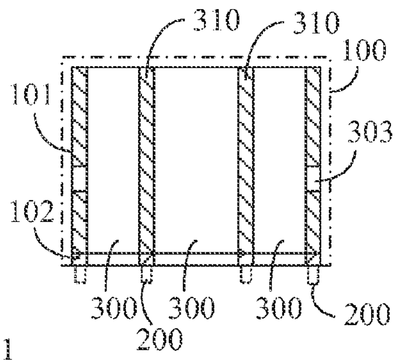
FIG. 1 is a cross sectional view showing the basic structure of the heat dissipater (100), according to the present invention.

100: Heat dissipater
101: Surface of heat dissipater
102: Intermediate heat conductor
1021: Rectangular plug-shaped intermediate heat conductor
1022: Rectangular plug-shaped intermediate heat conductor having central hole
1023: Circular plug-shaped intermediate heat conductor
1024: Circular plug-shaped intermediate heat conductor having central hole
103: Central column
105: Tooth notch
109: Protection net
110: Top cover
111: Support column
112: Ventilation port
200: Electric luminous body
300, 302: Flow guide hole
303: Radial flow guide hole
310: Heat conductive rib structure

DETAILED DESCRIPTION OF THE PREFERRED EMBODIMENTS

A conventional heat dissipation device applicable in the electric luminous body (200) of an electric illumination device, e.g. the heat dissipater used in a LED illumination device, usually transmits the heat generated by the LED to the heat dissipater then dissipates the heat to the exterior through the surface of the heat dissipater, thereby limiting the heat dissipation area.

The present invention provides a heat dissipater having heat conductive rib with interval forming as flow guide hole and applied in electric luminous body in which a heat conductive rib structure (310) being installed inside the heat dissipater for meeting the heat dissipation requirement of an electric luminous body, e.g. the heat dissipation requirement of a light emitting diode (LED) which is adopted as the electric luminous body (200), and the intervals defined by the heat conductive rib structure (310) is formed as flow guide holes (300) penetrating both sides axially and throughout, the contour of the heat dissipater (100) includes being formed in a cylindrical, conical, polygonal cylindrical or polygonal conical shape, a part of the outer bottom is combined with an intermediate heat conductor (102) where the electric luminous body (200) being installed, the flow guide holes (300) are not totally shielded after the intermediate heat conductor (102) being combined with the heat dissipater (100), the interior of the heat dissipater (100) is installed with the heat conductive rib structure (310) for being combined with the inner periphery of the heat dissipater (100), the bottom thereof is installed with the intermediate heat conductor (102), the intermediate heat conductor (102) is installed with the electric luminous body (200) and formed as the heat source, so the heat from the electric luminous body (200) can be conducted through the intermediate heat conductor (102) to the surface of the heat conductive rib structure (310) and the surface of heat dissipater (101), thereby forming a larger heat dissipation area for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; the heat dissipater having heat conductive rib with interval forming as flow guide hole and applied in electric luminous body of the present invention utilizes the intervals defined by the heat conductive rib structure (310) for forming as the flow guide holes (300) penetrating both sides throughout, the heat dissipater (100) is further formed with flow guide holes allowing airflow to pass, and the installation location of flow guide hole includes one or more than one of the followings: (a) installing one or more radial flow guide holes (303) in the heat dissipater (100); (b) installing one or more flow guide holes (302), which axially penetrate the central column (103), at the axial core center.

Figure 2:
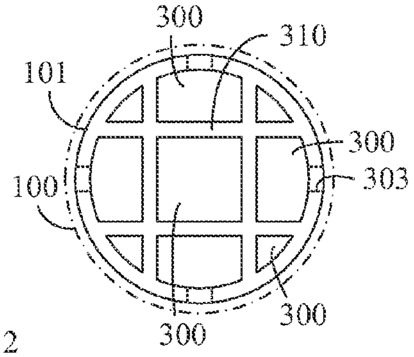
FIG. 2 is a top view of FIG. 1.

FIG. 1 is a cross sectional view showing the basic structure of the heat dissipater (100), according to the present invention;

FIG. 2 is a top view of FIG. 1;

As shown in FIG. 1 and FIG. 2, it mainly consists of:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a multiple grid state or formed in a multiple grid state having three or more sides (FIG. 1 is the embodiment formed in a rectangular grid state);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes installing one or more radial flow guide holes (303) in the heat dissipater (100).

Figure 3:
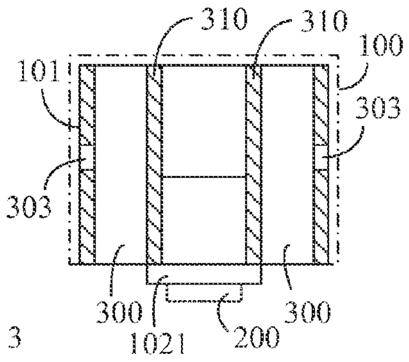
FIG. 3 is a schematic view showing the bottom of the heat dissipater (100) shown in FIG. 1 being installed with a rectangular plug-shaped intermediate heat conductor (1021) having the same width as the heat conductive rib structure (310), according to one embodiment of the present invention.

According to the heat dissipater having heat conductive rib with interval forming as flow guide hole and applied in electric luminous body of the present invention, when the heat conductive rib structure (310) of the heat dissipater (100) is formed in a rectangular grid structure, the examples of being further installed with the intermediate heat conductor (102) are as followings:

FIG. 3 is a schematic view showing the bottom of the heat dissipater (100) shown in FIG. 1 being installed with a rectangular plug-shaped intermediate heat conductor (1021) having the same width as the heat conductive rib structure (310), according to one embodiment of the present invention;

As shown in FIG. 3, the structures of the heat dissipater (100) and the heat conductive rib structure (310) are the same as FIG. 1, and it mainly consists of:

rectangular plug-shaped intermediate heat conductor (1021): the rectangular plug-shaped intermediate heat conductor (1021) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

Figure 4:
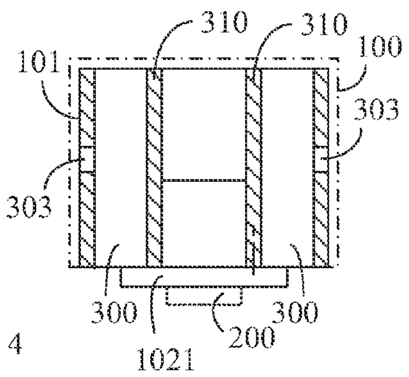
FIG. 4 is a schematic view showing the bottom of the heat dissipater (100) shown in FIG. 1 being installed with a rectangular plug-shaped intermediate heat conductor (1021) having the width slightly wider than the heat conductive rib structure (310), according to another embodiment of the present invention.

FIG. 4 is a schematic view showing the bottom of the heat dissipater (100) shown in FIG. 1 being installed with a rectangular plug-shaped intermediate heat conductor (1021) having the width slightly wider than the heat conductive rib structure (310), according to another embodiment of the present invention;

As shown in FIG. 4, the structures of the heat dissipater (100) and the heat conductive rib structure (310) are the same as FIG. 1, and it mainly consists of:

- rectangular plug-shaped intermediate heat conductor (1021): the rectangular plug-shaped intermediate heat conductor (1021) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);
- electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

Figure 5:
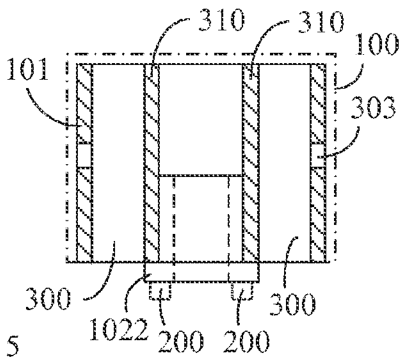
FIG. 5 is a schematic view showing the bottom of the heat dissipater (100) shown in FIG. 1 being installed with a rectangular plug-shaped intermediate heat conductor having central hole (1022) having the same width as the heat conductive rib structure (310), according to one embodiment of the present invention.

FIG. 5 is a schematic view showing the bottom of the heat dissipater (100) shown in FIG. 1 being installed with a rectangular plug-shaped intermediate heat conductor having central hole (1022) having the same width as the heat conductive rib structure (310), according to one embodiment of the present invention;

As shown in FIG. 5, the structures of the heat dissipater (100) and the heat conductive rib structure (310) are the same as FIG. 1, and it mainly consists of:

- rectangular plug-shaped intermediate heat conductor having central hole (1022): the rectangular plug-shaped intermediate heat conductor having central hole (1022) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);
- electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

Figure 6:
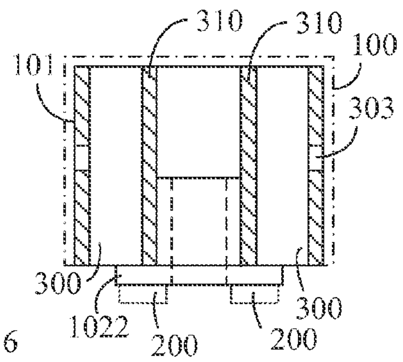
FIG. 6 is a schematic view showing the bottom of the heat dissipater (100) shown in FIG. 1 being installed with a rectangular plug-shaped intermediate heat conductor having central hole (1022) having the width slightly wider than the heat conductive rib structure (310), according to another embodiment of the present invention.

FIG. 6 is a schematic view showing the bottom of the heat dissipater (100) shown in FIG. 1 being installed with a rectangular plug-shaped intermediate heat conductor having central hole (1022) having the width slightly wider than the heat conductive rib structure (310), according to another embodiment of the present invention;

As shown in FIG. 6, the structures of the heat dissipater (100) and the heat conductive rib structure (310) are the same as FIG. 1, and it mainly consists of:

- rectangular plug-shaped intermediate heat conductor having central hole (1022): the rectangular plug-shaped intermediate heat conductor having central hole (1022) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);
- electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

Figure 7:
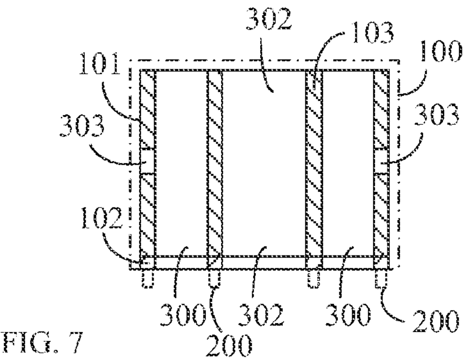
FIG. 7 is a cross sectional view illustrating the bottom of the heat dissipater (100) being installed with the electric luminous body (200), the axial core of the heat dissipater (100) being a tubular central column (103) having a penetrated hole, the heat conductive rib structure (310) being formed in a radially state for connecting the inner and outer dual annular members of a single circle, and the flow guide holes (300) being formed between the dual annular members, according to the present invention.
Figure 8:
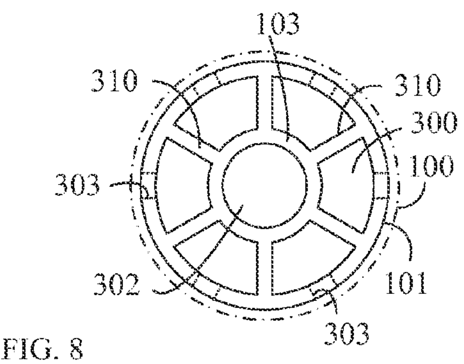
FIG. 8 is a top view of FIG. 7.
Figure 25:
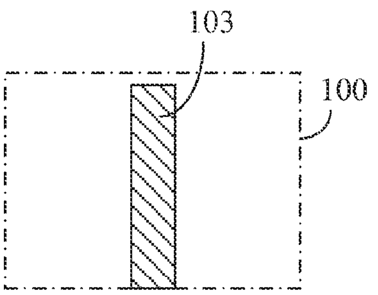
FIG. 25 is a schematic structural view illustrating the central column (103) being composed as a solid structure, according to one embodiment of the present invention.

FIG. 7 is a cross sectional view illustrating the bottom of the heat dissipater (100) being installed with the electric luminous body (200), the axial core of the heat dissipater (100) being a tubular central column (103) having a penetrated hole, the heat conductive rib structure (310) being formed in a radially state for connecting the inner and outer dual annular members of a single circle, and the flow guide holes (300) being formed between the dual annular members, according to the present invention;

FIG. 8 is a top view of FIG. 7;

As shown in FIG. 7 and FIG. 8, it mainly consists of:

- heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 7 is the embodiment of a tubular central structure), or a solid central column (103) (as shown in FIG. 25), the heat conductive rib structure (310) is formed in a radially state for connecting the inner and outer dual annular members of a single circle, and the flow guide holes (300) are formed between the dual annular members, and one or both of the periphery and/or the inner annular surface thereof is formed as a planar or wavelike structure or one or both of the inner periphery and the outer periphery is formed as a structure having heat dissipation fins;
- heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 8 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 7).

Figure 9:
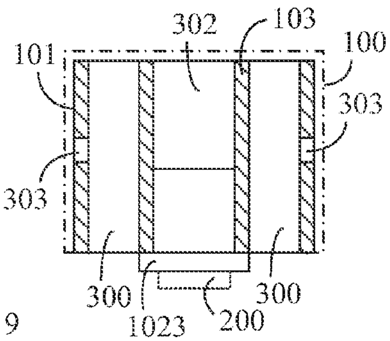
FIG. 9 is a schematic view of the first embodiment of the present invention illustrating the bottom of the heat dissipater (100) shown in FIG. 7 being installed with a circular plug-shaped intermediate heat conductor (1023).

FIG. 9 is a schematic view of the first embodiment of the present invention illustrating the bottom of the heat dissipater (100) shown in FIG. 7 being installed with a circular plug-shaped intermediate heat conductor (1023);

As shown in FIG. 9, the structure is the same as FIG. 7, and it mainly consists of:

circular plug-shaped intermediate heat conductor (1023): the circular plug-shaped intermediate heat conductor (1023) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 9 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, and one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 8 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 9).

Figure 10:
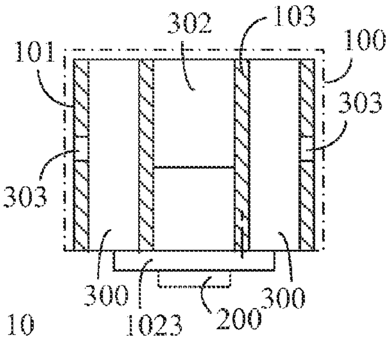
FIG. 10 is a schematic view of the second embodiment of the present invention illustrating the bottom of the heat dissipater (100) shown in FIG. 7 being installed with a circular plug-shaped intermediate heat conductor (1023).

FIG. 10 is a schematic view of the second embodiment of the present invention illustrating the bottom of the heat dissipater (100) shown in FIG. 7 being installed with a circular plug-shaped intermediate heat conductor (1023);

As shown in FIG. 10, the structure is the same as FIG. 7, and it mainly consists of:

circular plug-shaped intermediate heat conductor (1023): the circular plug-shaped intermediate heat conductor (1023) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 10 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 8 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 10).

Figure 11:
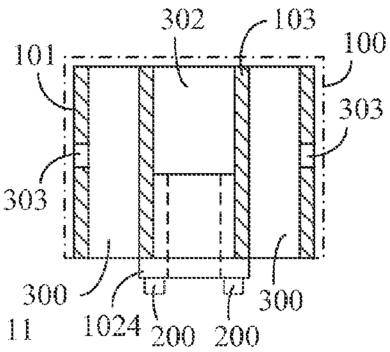
FIG. 11 is a schematic view of the first embodiment of the present invention illustrating the bottom of the heat dissipater (100) shown in FIG. 7 being installed with a circular plug-shaped intermediate heat conductor having central hole (1024).

FIG. 11 is a schematic view of the first embodiment of the present invention illustrating the bottom of the heat dissipater (100) shown in FIG. 7 being installed with a circular plug-shaped intermediate heat conductor having central hole (1024);

As shown in FIG. 11, the structure is the same as FIG. 7, and it mainly consists of:

circular plug-shaped intermediate heat conductor having central hole (1024): the circular plug-shaped intermediate heat conductor having central hole (1024) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 11 is the embodiment of a hollow column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 8 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 11).

Figure 12:
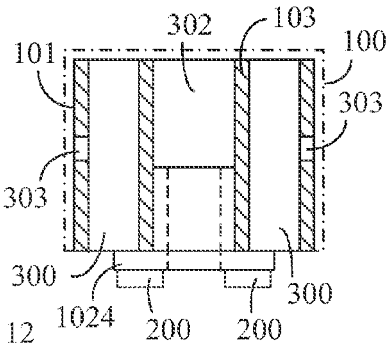
FIG. 12 is a schematic view of the second embodiment of the present invention illustrating the bottom of the heat dissipater (100) shown in FIG. 7 being installed with a circular plug-shaped intermediate heat conductor having central hole (1024).

FIG. 12 is a schematic view of the second embodiment of the present invention illustrating the bottom of the heat dissipater (100) shown in FIG. 7 being installed with a circular plug-shaped intermediate heat conductor having central hole (1024);

As shown in FIG. 12, the structure is the same as FIG. 7, and it mainly consists of:

circular plug-shaped intermediate heat conductor having central hole (1024): the circular plug-shaped intermediate heat conductor having central hole (1024) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 12 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 8 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 12).

Figure 13:
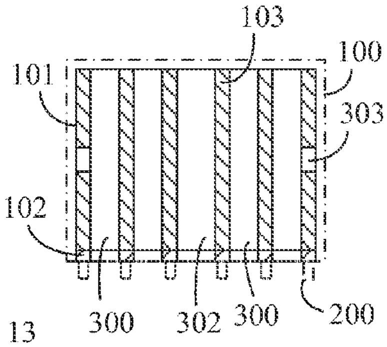
FIG. 13 is a cross sectional view illustrating the heat dissipater (100) being formed in a multiple annular rings structure and the radially-extended heat conductive rib structure (310) being utilized for connecting, according to the present invention.
Figure 14:
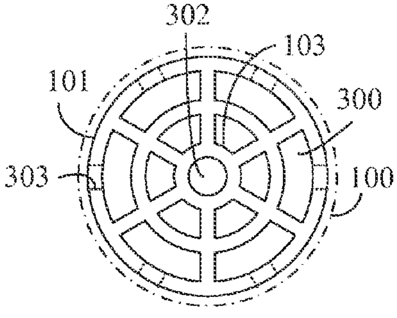
FIG. 14 is a top view of FIG. 13.

According to the embodiment illustrating the heat dissipater having heat conductive rib with interval forming as flow guide hole and applied in electric luminous body disclosed in FIG. 7, the heat dissipater (100) can be further formed in a multiple annular ring structure;

FIG. 13 is a cross sectional view illustrating the heat dissipater (100) being formed in a multiple annular rings structure and the radially-extended heat conductive rib structure (310) being utilized for connecting, according to the present invention;

FIG. 14 is a top view of FIG. 13;

As shown in FIG. 13 and FIG. 14, the structure is the same as FIG. 7, and it mainly consists of:

the heat dissipater (100) is formed in the multiple annular rings structure, and the radially-extended heat conductive rib structure (310) is utilized for connecting;

the mentioned multiple annular ring structure is defined as three or more annular rings; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 13 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 14 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 13).

Figure 15:
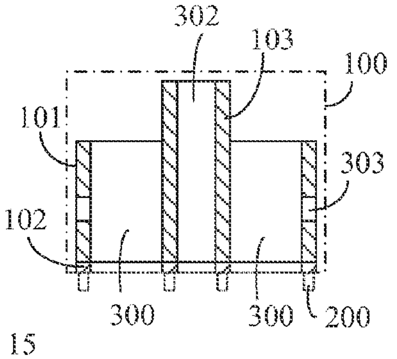
FIG. 15 is a cross sectional view illustrating the heat dissipater (100) being formed in a stepped structure having the higher central column (103) and the lower outer annular ring, according to the present invention.
Figure 16:
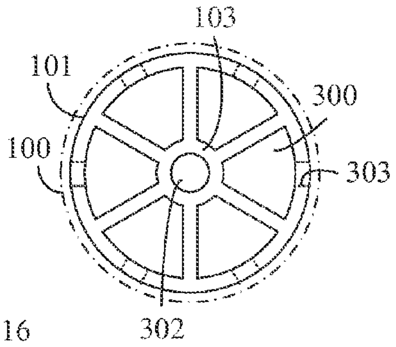
FIG. 16 is a top view of FIG. 15.

According to the embodiment illustrating the heat dissipater having heat conductive rib with interval forming as flow guide hole and applied in electric luminous body disclosed in FIG. 7, the heat dissipater (100) can be further formed as a structure having the higher central column (103) and the lower outer annular ring;

FIG. 15 is a cross sectional view illustrating the heat dissipater (100) being formed in a stepped structure having the higher central column (103) and the lower outer annular ring, according to the present invention;

FIG. 16 is a top view of FIG. 15;

As shown in FIG. 15 and FIG. 16, the structure is the same as FIG. 7, and it mainly consists of:

the heat dissipater (100) is formed in the stepped structure having the higher central column (103) and the lower outer annular ring, and the radially-extended heat conductive rib structure (310) is utilized for connecting; wherein heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 15 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 16 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b)

installing one or more flow guide holes (302), which axially penetrate the central column (103), at the axial core center (as shown in FIG. 15).

Figure 17:
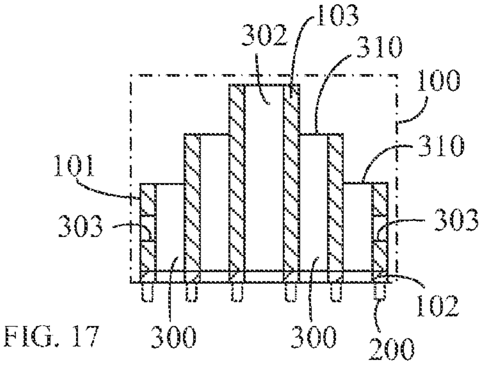
FIG. 17 is a cross sectional view illustrating the heat dissipater (100) being formed in a multiple stepped structure having the higher central column (103) and the lower outer annular ring, according to the present invention.
Figure 18:
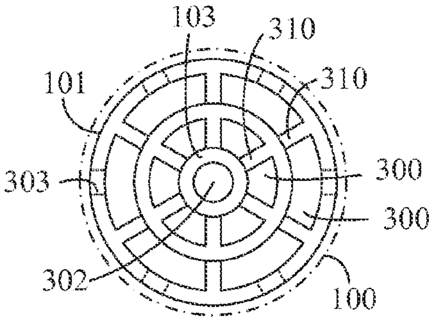
FIG. 18 is a top view of FIG. 17.

According to the embodiment illustrating the heat dissipater having heat conductive rib with interval forming as flow guide hole and applied in electric luminous body disclosed in FIG. 7, the heat dissipater (100) can be further formed as a multiple annular rings structure;

FIG. 17 is a cross sectional view illustrating the heat dissipater (100) being formed in a multiple stepped structure having the higher central column (103) and the lower outer annular ring, according to the present invention;

FIG. 18 is a top view of FIG. 17;

As shown in FIG. 17 and FIG. 18, the structure is the same as FIG. 7, and it mainly consists of:

the heat dissipater (100) is formed in the multiple stepped structure having the higher central column (103) and the lower outer annular ring, and the radially-extended heat conductive rib structure (310) being utilized for connecting;

the mentioned multiple annular ring structure is defined as three or more annular rings; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 17 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 18 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 17).

Figure 19:
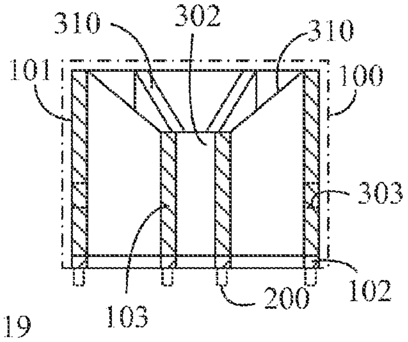
FIG. 19 is a cross sectional view illustrating the heat dissipater (100) being formed in a stepped structure having the lower central column (103) and the higher outer annular ring, according to the present invention.
Figure 20:
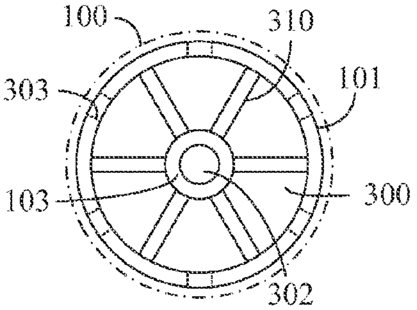
FIG. 20 is a top view of FIG. 19.

According to the embodiment illustrating the heat dissipater having heat conductive rib with interval forming as flow guide hole and applied in electric luminous body disclosed in FIG. 7, the heat dissipater (100) can be further formed as a structure having the lower central column (103) and the higher outer annular ring;

FIG. 19 is a cross sectional view illustrating the heat dissipater (100) being formed in a stepped structure having the lower central column (103) and the higher outer annular ring, according to the present invention;

FIG. 20 is a top view of FIG. 19;

As shown in FIG. 19 and FIG. 20, the structure is the same as FIG. 7, and it mainly consists of:

the heat dissipater (100) is formed in the stepped structure having the lower central column (103) and the higher outer annular ring, and the radially-extended heat conductive rib structure (310) being utilized for connecting; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 19 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 20 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 19).

Figure 21:
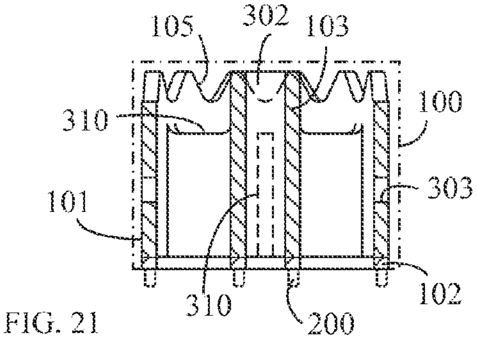
FIG. 21 is a cross sectional view illustrating the upper end of the outer annular ring of the heat dissipater (100) is formed with the crown-like tooth notch (105) and provided with the central column (103) and the heat conductive rib structure (310), according to the present invention.
Figure 22:
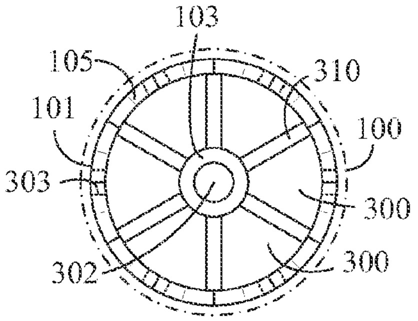
FIG. 22 is a top view of FIG. 21.

According to the embodiment illustrating the heat dissipater having heat conductive rib with interval forming as flow guide hole and applied in electric luminous body disclosed in FIG. 7, the outer annular member can be formed as a crown-like tooth notch (105);

FIG. 21 is a cross sectional view illustrating the upper end of the outer annular ring of the heat dissipater (100) is formed with the crown-like tooth notch (105) and provided with the central column (103) and the heat conductive rib structure (310), according to the present invention;

FIG. 22 is a top view of FIG. 21;

As shown in FIG. 21 and FIG. 22, the structure is the same as FIG. 7, and it mainly consists of:

the upper end of the outer annular ring of the heat dissipater (100) is formed with the crown-like tooth notch (105) and a structure of the central column (103) and the outer periphery being at the same or different height, and the radially-extended heat conductive rib structure (310) being utilized for connecting; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 21 is the embodiment of a tubular central structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 22 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 21).

Figure 23:
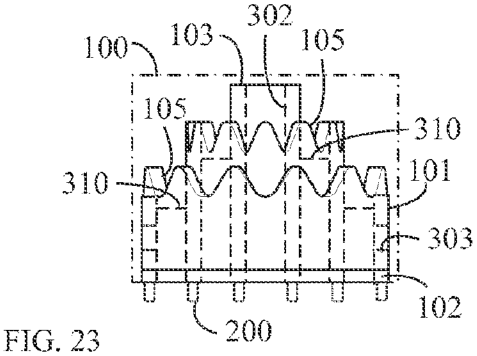
FIG. 23 is a schematic view illustrating the central column (103) of the heat dissipater (100) being higher and the upper end of the multiple outer annular rings with gradually lowered height being formed as a multiple crown-like tooth notch (105), according to the present invention.
Figure 24:
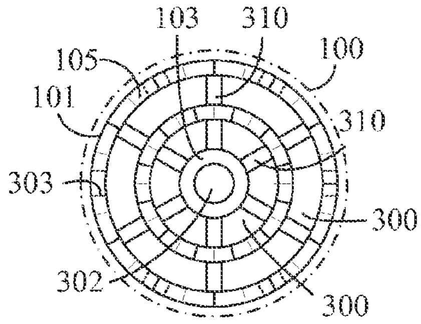
FIG. 24 is a top view of FIG. 23.

FIG. 23 is a schematic view illustrating the central column (103) of the heat dissipater (100) being higher and the upper end of the multiple outer annular rings with gradually lowered height being formed as a multiple crown-like tooth notch (105), according to the present invention;

FIG. 24 is a top view of FIG. 23;

As shown in FIG. 23 and FIG. 24, the structure is the same as FIG. 17, and it mainly consists of:

the radially-extended heat conductive rib structure (310) is served to connect the central column (103) of the heat dissipater (100) being higher and the upper end of the multiple outer annular rings with gradually lowered height being formed as a multiple crown-like tooth notch (105);

the multiple annular rings structure of the mentioned multiple crown-like tooth notches (105) is defined as two or more layers; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103) (FIG. 23 is the embodiment of a tubular central column structure), or a solid central column (103) (as shown in FIG. 25), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member (FIG. 24 is the embodiment formed in a radially extended state with six equal portions);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center (as shown in FIG. 23).

According to the heat dissipater having heat conductive rib with interval forming as flow guide hole and applied in electric luminous body of the present invention, the central column (103) can be further composed of a solid structure;

FIG. 25 is a schematic structural view illustrating the central column (103) being composed as a solid structure, according to one embodiment of the present invention;

As shown in FIG. 25, the central column (103) of the present invention is formed in a solid structure.

Figure 26:
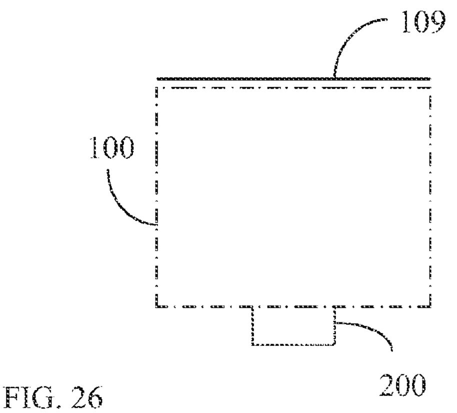
FIG. 26 is a schematic lateral view illustrating the top of the heat dissipater (100) opposite to the installation location of the electric luminous body (200) being additionally installed with a protection net (109), according to one embodiment of the present invention.

FIG. 26 is a schematic lateral view illustrating the top of the heat dissipater (100) opposite to the installation location of the electric luminous body (200) being additionally installed with a protection net (109), according to one embodiment of the present invention;

As shown in FIG. 26, according to one embodiment of the present invention, the top of the heat dissipater (100) opposite to the installation location of the electric luminous body (200) is additionally installed with the protection net (109).

Figure 27:
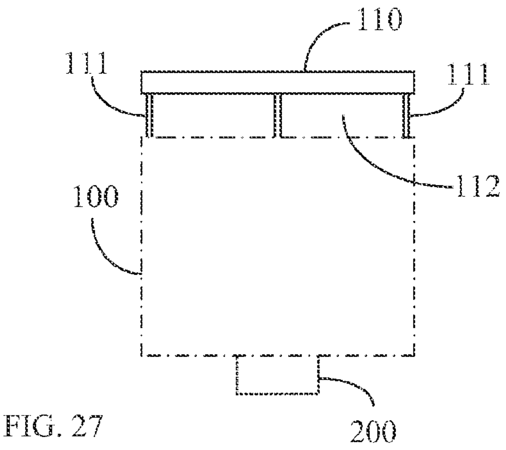
FIG. 27 is a schematic lateral view illustrating the top of the heat dissipater (100) opposite to the installation location of the electric luminous body (200) being installed with a top cover (110), and formed with a ventilation port (112) and a support column (111) served for connecting and supporting between the top cover (110) and the heat dissipater (100), according to one embodiment of the present invention.

FIG. 27 is a schematic lateral view illustrating the top of the heat dissipater (100) opposite to the installation location of the electric luminous body (200) being installed with a top cover (110), and formed with a ventilation port (112) and a support column (111) served for connecting and supporting between the top cover (110) and the heat dissipater (100), according to one embodiment of the present invention;

As shown in FIG. 27, according to one embodiment of the present invention, the top of the heat dissipater (100) opposite to the installation location of the electric luminous body (200) is installed with the top cover (110), and formed with the ventilation port (112) and the support column (111) served for connecting and supporting between the top cover (110) and the heat dissipater (100).

Figure 28:
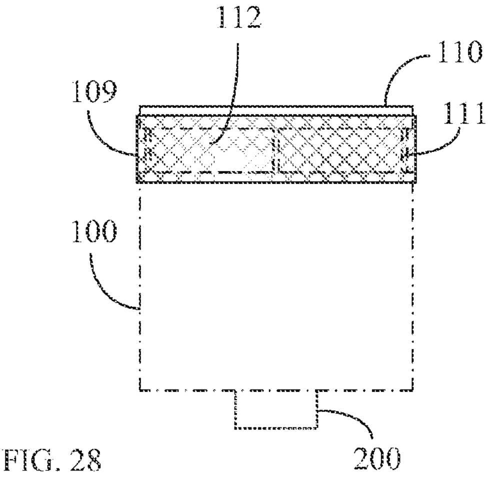
FIG. 28 is a schematic lateral view illustrating the support column (111) served for connecting and supporting being installed between the top of the heat dissipater (100) opposite to the installation location of the electric luminous body (200) and the top cover (110), and the periphery of the ventilation port (112) being additionally installed with the protection net (109), according to one embodiment of the present invention.

FIG. 28 is a schematic lateral view illustrating the support column (111) served for connecting and supporting being installed between the top of the heat dissipater (100) opposite to the installation location of the electric luminous body (200) and the top cover (110), and the periphery of the ventilation port (112) being additionally installed with the protection net (109), according to one embodiment of the present invention;

As shown in FIG. 28, according to one embodiment of the present invention, the support column (111) served for connecting and supporting is installed between the top of the heat dissipater (100) opposite to the installation location of the electric luminous body (200) and the top cover (110), and the periphery of the ventilation port (112) is additionally installed with the protection net (109).

The mentioned electric luminous body (200) according to the heat dissipater having heat conductive rib with interval forming as flow guide hole and applied in electric luminous body of the present invention can further include being composed of the electric luminous body and optical component and lampshade.

The invention claimed is:

1. A heat dissipater having heat conductive rib with interval forming as flow guide hole and applied in electric luminous body, in which a heat conductive rib structure (310) being installed inside the heat dissipater, and the intervals defined by the heat conductive rib structure (310) is formed as flow guide holes (300) penetrating both sides axially and throughout, the contour of the heat dissipater (100) includes being formed in a cylindrical, conical, polygonal cylindrical or polygonal conical shape, a part of the outer bottom is combined with an intermediate heat conductor (102) where the electric luminous body (200) being installed, the flow guide holes (300) are not totally shielded after the intermediate heat conductor (102) being combined with the heat dissipater (100), the interior of the heat dissipater (100) is installed with the heat conductive rib structure (310) for being combined with the inner periphery of the heat dissipater (100), the bottom thereof is installed with the intermediate heat conductor (102), the intermediate heat conductor (102) is installed with the electric luminous body (200) and formed as the heat source, so the heat from the electric luminous body (200) can be conducted through the intermediate heat conductor (102) to the surface of the heat conductive rib structure (310) and the surface of heat dissipater (101), thereby forming a larger heat dissipation area for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; the heat dissipater having heat conductive rib with interval forming as flow guide hole and applied in electric luminous body of the present invention utilizes the intervals defined by the heat conductive rib structure (310) for forming as the flow guide holes (300) penetrating both sides throughout, the heat dissipater (100) is further formed with flow guide holes allowing airflow to pass, and it mainly consists of:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a multiple grid state or formed in a multiple grid state having three or more sides;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes installing one or more radial flow guide holes (303) in the heat dissipater (100).

2. A heat dissipater having heat conductive rib with interval forming as flow guide hole and applied in electric luminous body as claimed in claim 1, wherein when the heat conductive rib structure (310) of the heat dissipater (100) is formed in a rectangular grid structure, the intermediate heat conductor (102) is further installed, and it mainly consists of:

rectangular plug-shaped intermediate heat conductor (1021): the rectangular plug-shaped intermediate heat conductor (1021) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

3. A heat dissipater having heat conductive rib with interval forming as flow guide hole and applied in electric luminous body as claimed in claim 1, wherein the bottom of the heat dissipater (100) is further installed with a rectangular plug-shaped intermediate heat conductor (1021) having the width slightly wider than the heat conductive rib structure (310), and it mainly consists of:

rectangular plug-shaped intermediate heat conductor (1021): the rectangular plug-shaped intermediate heat conductor (1021) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

4. A heat dissipater having heat conductive rib with interval forming as flow guide hole and applied in electric luminous body as claimed in claim 1, wherein the bottom of the heat dissipater (100) is further installed with a rectangular plug-shaped intermediate heat conductor having central hole (1022) having the same width as the heat conductive rib structure (310), and it mainly consists of:

rectangular plug-shaped intermediate heat conductor having central hole (1022): the rectangular plug-shaped intermediate heat conductor having central hole (1022) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

5. A heat dissipater having heat conductive rib with interval forming as flow guide hole and applied in electric luminous body as claimed in claim 1, wherein the bottom of the heat dissipater (100) is further installed with a rectangular plug-shaped intermediate heat conductor having central hole (1022) having the width slightly wider than the heat conductive rib structure (310), and it mainly consists of:

rectangular plug-shaped intermediate heat conductor having central hole (1022): the rectangular plug-shaped intermediate heat conductor having central hole (1022) is equipped with the same function as the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200);

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations.

6. A heat dissipater having heat conductive rib with interval forming as flow guide hole and applied in electric luminous body as claimed in claim 1, wherein the bottom of the heat dissipater (100) is further installed with the electric luminous body (200), the axial core of the heat dissipater (100) is a tubular central column (103) having a penetrated hole, the heat conductive rib structure (310) is formed in a radially state for connecting the inner and outer dual annular members of a single circle, and the flow guide holes (300) is formed between the dual annular members, and it mainly consists of:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, and one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings:

(a) installing one or more radial flow guide holes (303) in the heat dissipater (100); or (b) installing one or more flow guide holes (302), which axially penetrate the central column (103), at the axial core center.

7. A heat dissipater having heat conductive rib with interval forming as flow guide hole and applied in electric luminous body as claimed in claim 6, wherein the bottom of the heat dissipater (100) is further installed with a circular plug-shaped intermediate heat conductor (1023), and it mainly consists of:

circular plug-shaped intermediate heat conductor (1023): the circular plug-shaped intermediate heat conductor (1023) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, and one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

8. A heat dissipater having heat conductive rib with interval forming as flow guide hole and applied in electric luminous body as claimed in claim 6, wherein the bottom of the heat dissipater (100) is further installed with a circular plug-shaped intermediate heat conductor (1023), and it mainly consists of:

circular plug-shaped intermediate heat conductor (1023): the circular plug-shaped intermediate heat conductor (1023) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

9. A heat dissipater having heat conductive rib with interval forming as flow guide hole and applied in electric luminous body as claimed in claim 6, wherein the bottom of the heat dissipater (100) is further installed with a circular plug-shaped intermediate heat conductor having central hole (1024), and it mainly consists of:

circular plug-shaped intermediate heat conductor having central hole (1024): the circular plug-shaped intermediate heat conductor having central hole (1024) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

10. A heat dissipater having heat conductive rib with interval forming as flow guide hole and applied in electric luminous body as claimed in claim 6, wherein the bottom of the heat dissipater (100) is further installed with a circular plug-shaped intermediate heat conductor having central hole (1024), and it mainly consists of:

circular plug-shaped intermediate heat conductor having central hole (1024): the circular plug-shaped intermediate heat conductor having central hole (1024) is equipped with the function of the intermediate heat conductor (102), made of materials having great heat conductivity, integrally formed with the heat dissipater (100) or installed at the bottom of the flow guide hole (300) of the heat dissipater (100) with a locking, mounting, welding, screwing means or directly combined with the intermediate heat conductor for being installed with one or more of the electric luminous bodies (200); wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

11. A heat dissipater having heat conductive rib with interval forming as flow guide hole and applied in electric luminous body as claimed in claim 6, wherein the heat dissipater (100) is further formed in a multiple annular rings structure and the radially-extended heat conductive rib structure (310) being utilized for connecting, and it mainly consists of:

the heat dissipater (100) is formed in the multiple annular rings structure, and the radially-extended heat conductive rib structure (310) is utilized for connecting;

the mentioned multiple annular ring structure is defined as three or more annular rings; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

12. A heat dissipater having heat conductive rib with interval forming as flow guide hole and applied in electric luminous body as claimed in claim 6, wherein the heat dissipater (100) is further formed in a stepped structure having the higher central column (103) and the lower outer annular ring, and it mainly consists of:

the heat dissipater (100) is formed in the stepped structure having the higher central column (103) and the lower outer annular ring, and the radially-extended heat conductive rib structure (310) is utilized for connecting; wherein heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

13. A heat dissipater having heat conductive rib with interval forming as flow guide hole and applied in electric luminous body as claimed in claim 11, wherein the heat dissipater (100) is further formed in a multiple stepped structure having the higher central column (103) and the lower outer annular ring, and it mainly consists of:

the heat dissipater (100) is formed in the multiple stepped structure having the higher central column (103) and the lower outer annular ring, and the radially-extended heat conductive rib structure (310) being utilized for connecting;

the mentioned multiple annular ring structure is defined as three or more annular rings; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

14. A heat dissipater having heat conductive rib with interval forming as flow guide hole and applied in electric luminous body as claimed in claim 6, wherein the heat dissipater (100) is further formed in a stepped structure having the lower central column (103) and the higher outer annular ring, and it mainly consists of:

the heat dissipater (100) is formed in the stepped structure having the lower central column (103) and the higher outer annular ring, and the radially-extended heat conductive rib structure (310) being utilized for connecting; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

15. A heat dissipater having heat conductive rib with interval forming as flow guide hole and applied in electric luminous body as claimed in claim 6, wherein the upper end of the outer annular ring of the heat dissipater (100) is further formed with the crown-like tooth notch (105) and provided with the central column (103) and the heat conductive rib structure (310), and it mainly consists of:

the upper end of the outer annular ring of the heat dissipater (100) is formed with the crown-like tooth notch (105) and a structure of the central column (103) and the outer periphery being at the same or different height, and the radially-extended heat conductive rib structure (310) being utilized for connecting; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

16. A heat dissipater having heat conductive rib with interval forming as flow guide hole and applied in electric luminous body as claimed in claim 13, wherein the central column (103) of the heat dissipater (100) is higher and the upper end of the multiple outer annular rings with gradually lowered height is formed as a multiple crown-like tooth notch (105), and it mainly consists of:

the radially-extended heat conductive rib structure (310) is served to connect the central column (103) of the heat dissipater (100) being higher and the upper end of the multiple outer annular rings with gradually lowered height being formed as a multiple crown-like tooth notch (105);

the multiple annular rings structure of the mentioned multiple crown-like tooth notches (105) is defined as two or more layers; wherein:

heat dissipater (100): made of materials having great heat conductivity and heat dissipation property such as aluminum and copper, integrally formed or assembled by plural pieces; the interior of the heat dissipater is installed with a heat conductive rib structure (310), and the intervals defined by the heat conductive rib structure (310) are formed as flow guide holes (300) penetrating both sides axially and throughout, the contour of the heat dissipater (100) includes being formed in a cylindrical, conical, polygonal cylindrical or polygonal conical shape; the axial core of the heat dissipater (100) is a tubular central column (103), or a solid central column (103), the heat conductive rib structure (310) is formed in a radially state for connecting the inner and outer dual annular members of a single circle, and the flow guide holes (300) are formed between the dual annular members, one or both of the periphery and/or the inner annular surface thereof is formed as a planar or wavelike structure or one or both of the inner periphery and the outer periphery is formed as a structure having heat dissipation fins;

heat conductive rib structure (310): made by materials having great heat conductivity, installed within the inner periphery of the heat dissipater (100), integrally formed or assembled with the heat dissipater (100), the heat conductive rib structure (310) is formed in a radially extended state distributed between the central column (103) and the outer annular member;

electric luminous body (200): constituted by light emitting diodes, or composed of other electric luminous body capable of converting electric energy into optical energy accompanying with heat being generated, the bottom of the heat dissipater (100) or the intermediate heat conductor combined therewith is installed with one or more of the electric luminous bodies (200), or the bottom of the heat conductive rib structure (310) or the intermediate heat conductor combined therewith is installed with one or more of the electric luminous bodies (200), or installed at both locations;

the heat from the electric luminous body (200) is conducted through the heat conductive rib structure (310) and dissipated to the exterior through the surface of heat dissipater (101), and with the heat dissipation surface enlarged by the heat conductive rib structure (310), a larger heat dissipation area is formed for directly dissipating the heat, and with the fluid effect of hot ascent/cold descent, the airflow is enabled to upwardly flow from one side of the electric luminous body (200) through the flow guide holes (300) then flow out from the other side thereof thereby generating a cooling effect; in the heat dissipater having heat conductive rib with interval forming as flow guide hole and applied in electric luminous body of the present invention, not only the flow guide holes (300) penetrating both sides throughout are formed at the intervals defined by the heat conductive rib structure (310), but the heat dissipater (100) can also be optionally formed with flow guide holes allowing airflow to pass, and the installation location of the flow guide hole includes one or more than one of the followings: (a) installing one or more radial flow guide holes (303) in the heat dissipater (100); or (b) installing one or more flow guide holes (302), which axially penetrate the central column (103), at the axial core center.

17. A heat dissipater having heat conductive rib with interval forming as flow guide hole and applied in electric luminous body, wherein:

(a) the top of the heat dissipater (100) opposite to the installation location of the electric luminous body (200) is additionally installed with the protection net (109);

(b) the top of the heat dissipater (100) opposite to the installation location of the electric luminous body (200) is installed with the top cover (110), and formed with the ventilation port (112) and the support column (111) served for connecting and supporting between the top cover (110) and the heat dissipater (100);

(c) both (a) and (b) are installed.

* * * * *